United States Patent [19]
McClure

[11] Patent Number: 5,402,379
[45] Date of Patent: Mar. 28, 1995

[54] PRECHARGE DEVICE FOR AN INTEGRATED CIRCUIT INTERNAL BUS

[75] Inventor: David C. McClure, Carrollton, Tex.

[73] Assignee: SGS-Thomson Microelectronics, Inc., Carrollton, Tex.

[21] Appl. No.: 114,749

[22] Filed: Aug. 31, 1993

[51] Int. Cl.⁶ .............................................. G11C 7/00
[52] U.S. Cl. ........................ 365/203; 365/230.03
[58] Field of Search ............ 365/203, 190, 189.11, 365/207, 230.03; 307/530, 475

[56] References Cited

U.S. PATENT DOCUMENTS

| | | | |
|---|---|---|---|
| 4,780,852 | 10/1988 | Kajigaya | 365/203 |
| 4,941,128 | 7/1990 | Wada | 365/203 |
| 5,068,831 | 11/1991 | Hoshi | 365/190 |
| 5,262,995 | 11/1993 | Yu | 365/203 |
| 5,265,050 | 11/1993 | McLaury | 365/203 |

*Primary Examiner*—Eugene R. LaRoche
*Assistant Examiner*—A. Zarabian
*Attorney, Agent, or Firm*—Kenneth C. Hill; Lisa K. Jorgenson; Richard K. Robinson

[57] ABSTRACT

A method and apparatus for an improved precharge device for an internal bus of an integrated circuit. Multiple precharge devices connect to signal lines throughout an internal bus. The multiple precharge devices are distributed along the internal as opposed to a single precharge device at one end utilized prior thereto. The present invention reduces the time necessary to precharge signal lines due to the decreased effective RC time delay affecting each precharge device.

16 Claims, 2 Drawing Sheets

PRECHARGE DEVICE FOR AN INTEGRATED CIRCUIT INTERNAL BUS

BACKGROUND OF THE INVENTION

1. Field of the Invention

The present invention is a method and apparatus relating to integrated circuit devices, and more particularly to a method and apparatus for precharging an internal data bus of an integrated circuit.

2. Description of the Prior Art

Integrated circuits often include an internal bus consisting of parallel signal lines to which various functional circuitry is connected. In particular, memory circuits, which are organized into blocks of memory cells, often communicate data utilizing an internal data bus. The internal data bus in memory circuits accesses the blocks of memory cells located within the memory chip.

Modern memory circuits are required to operate at high speeds while possessing the highest density possible. In such memories, the series resistance and parasitic capacitance of relatively long signal lines in an internal data bus becomes a significant factor in the operating performance of the device. The signal lines in a data bus switch from one state to another as various memory cells are accessed, and any parasitic capacitance affects the time required for the signal line to switch. The inherent resistance of the signal lines also increases the time constant of the switching. In addition, as the density of a memory chip increases, the cross-sectional area of a signal line may decrease, increasing the resistance. The increased number of signal lines also tends to increase the parasitic capacitance in the lines.

Currently, to increase the efficiency of reading a stored state in a memory cell, the signal lines in a data bus are precharged to a pre-selected voltage. The stored state of each memory cell is then communicated to the signal lines utilizing bit lines. However, the bit lines are shorter and may have less than one-third of the capacitance of the data bus. Hence, the precharged stage of the signal lines is often the limiting factor in the cycle time for the device. If the signal lines have not been completely precharged, the digital value of the stored state of the memory cell may be incorrectly detected, or the detection process may be delayed.

As presently known in the art, signal lines in an internal data bus are precharged to a pre-selected voltage before the stored state of a memory cell is communicated to the signal lines. However, the parasitic capacitance and inherent resistance of the signal lines in an internal bus can create a large RC time constant. A large time constant increases the time required to completely precharge the signal lines. This delay is especially problematic in memory chips having long internal busses used to access memory cells. Thus, a short precharge stage of a signal line in a memory access cycle is needed.

Therefore, a method and apparatus is needed which decreases the time necessary for the precharge stage of the bus signal lines, prior to application of a stored memory state. Furthermore, the method and apparatus must not affect the density of the integrated circuit and increase the manufacturing cost of the integrated circuit.

SUMMARY OF THE INVENTION

The present invention is implemented in an integrated circuit, such as a memory, which contains an internal bus of parallel signal lines.

It reduces the delay created by the large RC time constant of an internal data bus by using multiple precharge devices distributed along the bus to precharge the signal line. The RC load of one precharge device is reduced when two precharge devices are used, thus significantly decreasing the RC time delay. Multiple precharge devices connected to the internal data bus can decrease the RC time delay even further.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
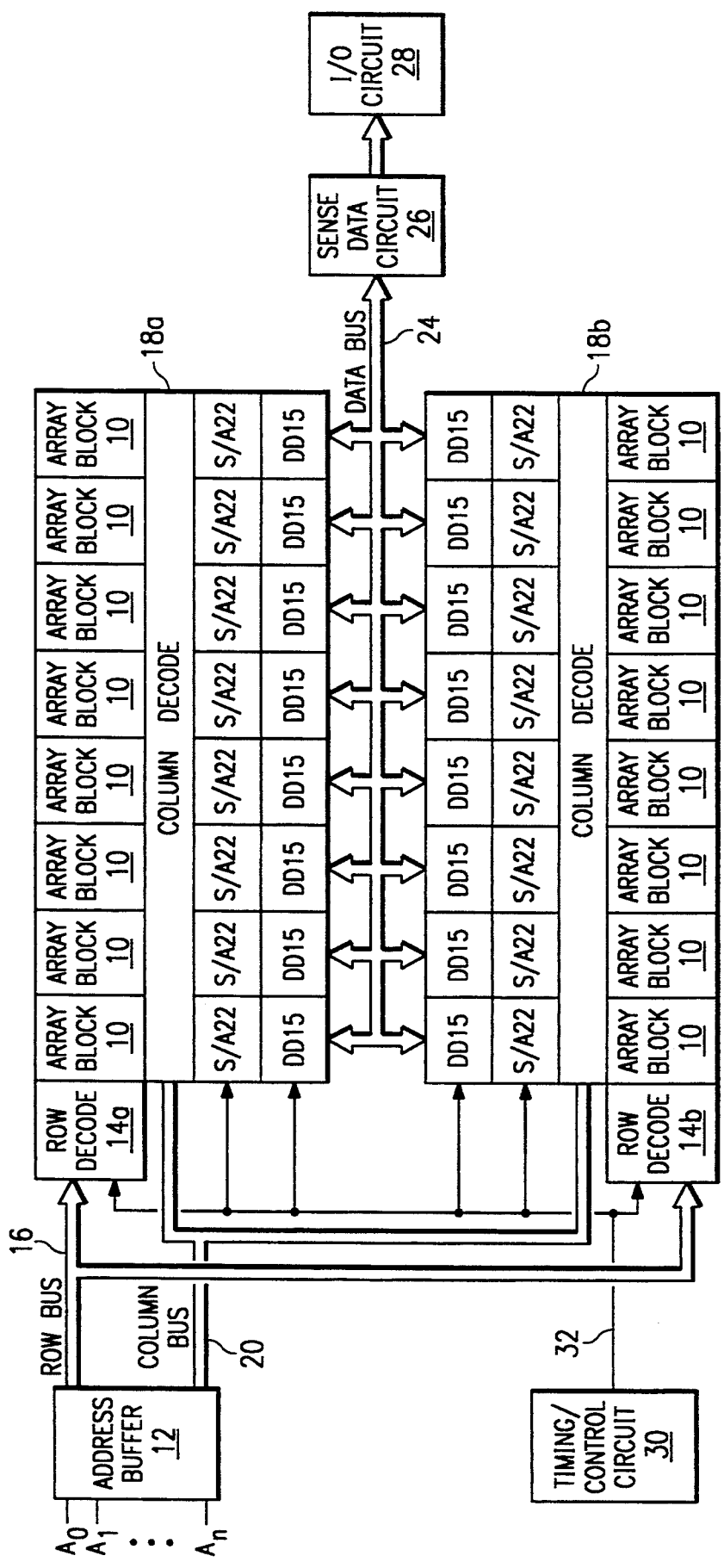
FIG. 1 is a block diagram of the architecture of a memory integrated circuit which may include the method and apparatus of the present invention.

With reference now to the figures and in particular with reference to FIG. 1, a block diagram depicts a memory integrated circuit into which the present invention may be incorporated. The figure illustrates a static random access memory (SRAM) having its memory cells in multiple array blocks 10. However, the present invention may be utilized in any integrated circuit in which long signal lines must be charged quickly to a particular voltage. Examples of such integrated circuits include microprocessors, logic devices, and other types of memories including read-only memories, FIFOs, DRAMs, EEPROMS and the like.

FIG. 1 illustrates a typical physical arrangement of the memory array blocks 10 in an SRAM memory chip. Each memory block consists of an array of memory cells which are arranged in rows and columns. The memory cells are selected according to an address signal received at address Terminals $A_o$ through $A_n$. Address terminals $A_o$ through $A_n$ connect to an address buffer 12 which buffers the address signal. Address buffer 12 then communicates a row portion of the address signal to row decoders 14a and 14b along bus 16 and communicates the column portion of the address signal to column decoders 18a and 18b along a separate column bus 20.

The row decoders 14a and 14b select a row of memory cells by enabling a particular word line among the rows of memory cells in array blocks 10. Then column decoders, 18a and 18b, select eight memory cells, according to the column portion of the address, in the selected row. A group of sense amplifiers 22 sense the stored state in each of the selected memory cells associated with the particular array block.

Each group of sense amplifiers 22 consists of eight individual sense amplifiers 22, one sense amplifier for each of the eight bits to be accessed and communicated in any one access memory cycle on the internal data bus 24. A group of eight data drivers 15 corresponds to each group of sense amplifiers 22, and one individual data driver 15 corresponds to each individual sense amplifier 22. In one cycle, eight data drivers 15 in one group receive the data signal for one bit of information from its corresponding sense amplifier 22 and drive the internal data bus 24 therewith. Hence, the internal data bus may communicate up to eight bits of information at one time. The relation between the data drivers 15 and the internal data bus 24 is described in more detail with respect to FIG. 2.

Next, the internal data bus 24 communicates the data signal to a data sense circuit 26 which detects the digital logic value of the data signal for each bit of information. Data sense circuit 26 then transfers the information to an input/output circuit 28, which includes conventional input and output buffers.

The timing of the process is partly controlled by timing and control circuit 30. Timing and control circuit 30 generates various control signals based on external and internal control signals received, such as a chip enable signal, a read/write select signal and an address transition signal. Timing and control circuit 30 connects to sense amplifiers 22 and data drivers 15 by control bus 32.

Figure 2:
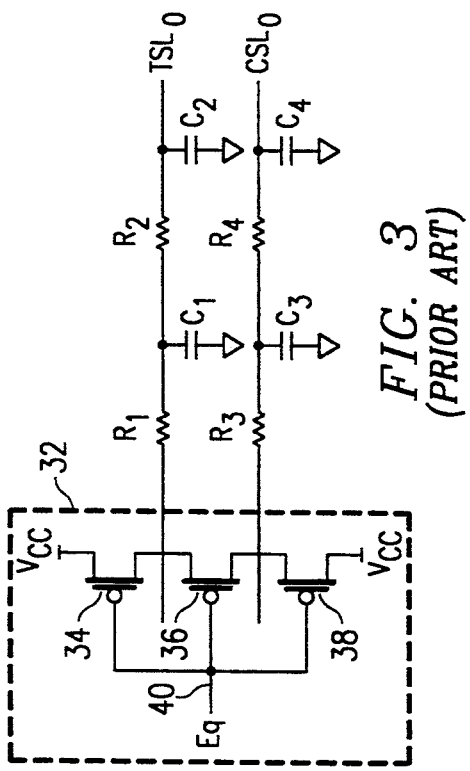
FIG. 2 is a block diagram of the connection of an internal data bus to data driver circuits for a sample array block.

Referring now to FIG. 2, a block diagram depicts the construction of an example internal data bus, such as the internal data bus 24, of FIG. 1. Internal data bus 24 includes true signal lines $TSL_0$ through $TSL_7$, each of which is associated with the complementary signal line $CSL_0$ through $CSL_7$. Each pair of a true signal line and a complementary signal line is associated with each data driver 15 and sense amplifier 22, as seen in FIG. 1. When a memory cell is activated, the stored state is detected by sense amplifier 22. Sense amplifier 22 can consist of a conventional CMOS latch, or any other sense amplifier as known in the art. Two complementary signal lines 30 convey the information to the corresponding pair of true signal lines and complementary signal lines in the internal data bus 24. The data driver associated with the pair of signal lines then switches the voltage level on the signal lines to correspond with the communicated information.

For example, in one operation of the above circuit, the memory cell corresponding to complementary signal lines $30a_1$ and $30a_2$ is activated. If the sense amplifier detects a logic "one" digital value stored in the memory cell, then the voltage level on signal line $30a_1$ will be high and the voltage level on signal line $30a_2$ will be low. The signal lines connect to the corresponding signal lines $TSL_0$ and $CSL_0$ where the data driver drives $TSL_0$ to a high voltage level and $CSL_0$ to a low voltage level to correspond to the information on the signal lines. Next, the true and complementary signal lines $TSL_0$ and $CSL_0$ connect to a sense data circuit at the end of the internal data bus 24 which detects the difference in the two voltages $TSL_0$ and $CSL_0$. Usually, a comparator within the sense circuit 26 is utilized to compare the voltage difference and detect the logic "one" digital value.

The process in the case that the sense amplifier detects a logic "zero" in a memory cell is similar, except that the voltage level on signal line $30a_1$ will be low and the voltage level on signal line $30a_2$ will be high, and the data driver 15 drives $TSL_0$ to low and $CSL_0$ to high. The sense data circuit 26 then detects the logic "zero" digital value.

The efficiency of the above process is increased by precharging the signal lines to a preselected value before the data driver drives the lines to a high or a low voltage level. By precharging the signal lines, both signal lines will never have to switch rail to rail, i.e. from high to a low voltage level. For example, if a precharge stage drives both signal lines to a high voltage, only one signal line will have to change to a low voltage in any one memory access cycle. However, the precharge stage must be completed prior to the data driving stage, or the signal lines may not reach the appropriate voltage levels during the data driving stage. This may cause the sense data circuit to detect a wrong digital logic value, as described with respect to FIG. 5.

When the signal lines are precharged to a high voltage, the data driver 15 drives either the true or complementary signal line to a low voltage level. The other line simply remains high. Data driver 15 often consists of two large n-channel transistors, one of which is connected to the true signal line and the other to the complementary signal line. After the precharge state, the data driver then activates the n-channel transistor corresponding to either the true or complementary signal line depending on the logic state detected by the sense amplifier. The selected n-channel transistor, which is connected to a low voltage, then drives the appropriate signal line to a low voltage. This change is detected in the sense data circuit 26.

Figure 3:
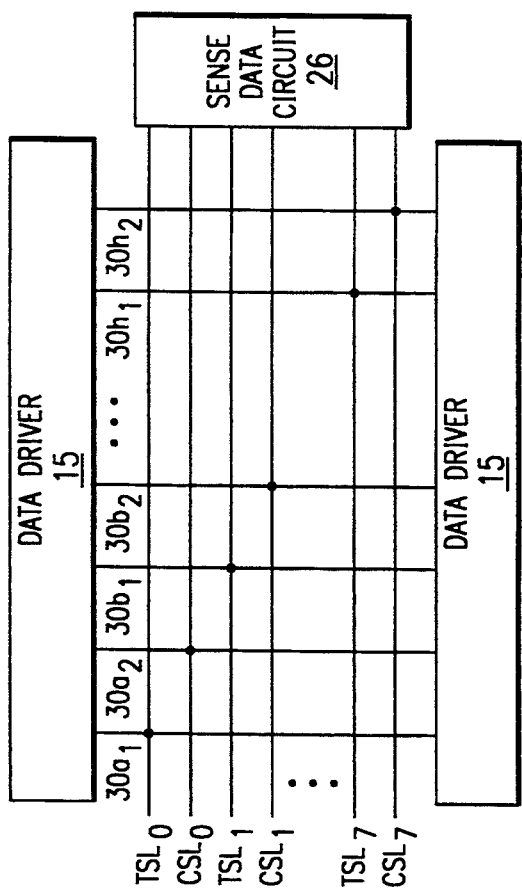
FIG. 3 is a schematic diagram of an internal data bus which includes a precharge device utilized in the prior art.

Referring now to FIG. 3, an electrical diagram illustrates a precharge device 32, known in the prior art. Precharge device 32 connects to a true signal line, such as true signal line $TSL_0$ of FIG. 2, and a complementary signal line, such as $CSL_0$. Precharge device 32 consists of three p-channel transistors, 34, 36, and 38. The gates of the three transistors form a common node and are controlled by a precharge/equilibrate signal. The sources of transistor 34 and 38 connect to Vcc, the high voltage supply of the integrated circuit. Consequently, transistors 34 and 38 pull the true and complementary signal lines to Vcc when the equilibrate signal is at a low logic level. Transistor 36, which connects the true signal line to the complementary signal line, concurrently pulls the voltage of the two lines to equal voltage levels.

When the precharge/equilibrate signal is at a high logic level, the three transistors are not conductive, isolating the true signal line and the complementary signal line from each other and Vcc. Therefore, the equilibrate signal must be a pulse of sufficient length in time to allow the true and complementary signals to reach the desired precharge voltage. The consequences that occur when the signal lines are not completely precharged is described with respect to FIG. 5.

Unfortunately, due to the parasitic capacitance and inherent resistance in a signal line, the precharge pulse must be quite long. The signal lines in data bus 24 run the length of the chip in order to connect the data drivers 15 for each of the array blocks 10. As such, the series resistance of each signal line is quite high, especially in high density circuits. For example, each signal line in an integrated circuit can be on the order of 13,200 u long, with a cross-sectional area of on the order of 1.1 u; and aluminum signal line of these dimensions will have a series resistance of on the order of 550 ohms. The series resistance inherent in signal lines $TSL_0$ and $CSL_0$ of FIG. 3 is represented by resistors $R_1$ through $R_4$.

In addition, with multiple data drivers 15 connected to each signal line, as well as the sense data circuit 26 connected thereto, the capacitance associated with a single signal line can be on the order of 4 Pf. This parasitic capacitance of signal lines $TSL_0$ and $CSL_0$ is represented in FIG. 3 by the capacitors $C_1$ through $C_4$. The resulting RC time constant of a signal line can thus be quite significant, requiring on the order of 2.2 nsec to switch from rail-to-rail for a 5 volt Vcc. The equilibrate pulse then must be at least 2.2 nsec to allow signal lines, such as signal lines $TSL_0$ and $CSL_0$ in FIG. 3, to charge to Vcc. This delay can greatly affect the read access time of the memory. Thus, any decrease in the time necessary to precharge the signal lines greatly increases the efficiency of the integrated circuit.

Figure 4:
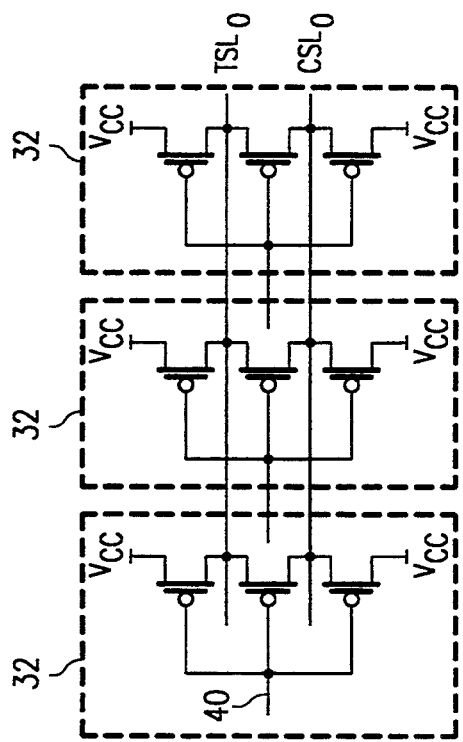
FIG. 4 is a schematic diagram of an internal data bus which includes a precharge device in accordance with the present invention.

Referring now to FIG. 4 a schematic diagram depicts an internal data bus which utilizes multiple precharge devices to decrease the time necessary for a precharge stage in accordance with the present invention. Precharge device 32 is again connected to a true signal line, such as $TSL_0$, and to a complementary signal line, such as $CSL_0$. However, other precharge devices 32 are now placed at various points along the signal lines. The precharge devices are all similar to precharge device 32, consisting of three p-channel transistors in series. In the present embodiment shown, the gates of all the transistors in each precharge device are connected to the precharge/equilibrate signal by a single signal line 40.

By distributing the precharge devices throughout the internal data bus, the effective RC load of each precharge device is reduced. For example, one precharge device has a load equal to RC, as described with respect to FIG. 3. If two precharge devices are placed at each end of the signal lines, each precharge device drives only half the signal line. The time constant with two precharge devices then equals RC divided by 4, as seen in the equation below.

$$t = \frac{R}{2} \times \frac{C}{2} = \frac{RC}{4}$$

Thus, the use of two precharge devices greatly reduces the RC delay in a precharge stage, cutting it by one-fourth.

More than two precharge devices distributed along an internal bus may further reduce the RC time constant of the bus. The exact number of precharge devices utilized depends on the length of the internal bus and the constraints due to the high density of the integrated circuit. Also, the parasitic capacitance of the signal lines increases with each additional precharge device, and thus, reduces the effectiveness of an additional precharge device at some point. The distribution of the multiple precharge devices along the internal data bus can also vary as the loading and resistance of the internal data bus dictate.

Alternatively, the precharge device 32, utilized in the present invention, may consist of n-channel transistors or a CMOS transmission gate which act as shoring devices to precharge the signal lines to a low voltage. In this embodiment of the invention, the data driver drives the true signal line or the complementary signal line, whichever is appropriate for the detected stored state, to a high voltage level.

Figure 5:
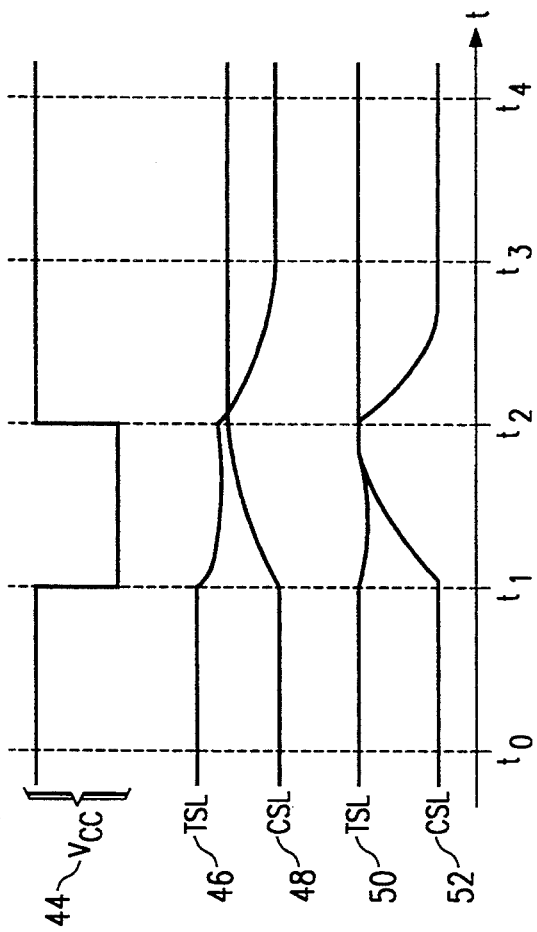
FIG. 5 is a timing diagram illustrating the operation of the present invention as compared with the operation of a single precharge device.

With reference now to FIG. 5, a timing diagram illustrates the operation of the present invention as compared with the operation of a single precharge device during one access memory cycle. In this example, the precharge device, as described in FIG. 3 and FIG. 4, consists of three p-channel transistors in series such that the true and complementary signal lines are precharged to a high voltage level. The memory access cycle begins at time $t_0$, with the precharge/equilibrate signal 44 at a high voltage level. At time $t_1$, the equilibrate signal pulses to a low voltage level and enables the precharge devices. At time $t_2$, the equilibrate/precharge signal switches back to a high voltage level. For the two example memory access cycles in FIG. 5, the sense amplifier detects a logic "zero" and the data driver begins driving the true line to a low voltage level at time $t_2$. Then, at time $t_3$, the sense data circuit is enabled and detects the voltage levels on the true and complementary signal lines.

The voltage level on true signal line 46 and complementary line 48 depicts what may occur in the above described read cycle in which the signal lines are not adequately precharged using only a single precharge device, shown in FIG. 3. At time $t_1$, the p-channel transistors in the precharge device 32 of FIG. 3 are enabled. The p-channel transistor 36 equilibrates the voltage levels on the true signal line and complementary signal line which causes the voltage level on the true signal line to dip slightly at first. The p-channel transistors 34 and 38 concurrently drive the voltage levels on the true and complementary levels to a high voltage level. At time $t_2$, the equilibrate signal switches back to a high voltage level, disabling precharge device 32, and again isolating the true and complementary signal lines from Vcc and from each other.

However, due to the RC delay of the signal lines, the equilibration period was not sufficiently long to fully precharge the signal lines to Vcc. Thus, he voltage level on the signal lines is much less than Vcc after the precharge stage.

Between $t_2$ and $t_3$, the data driver drives the true signal line to a low voltage level. Then at $t_3$, the sense data circuit 26 of FIG. 1, is enabled and compares the voltage difference between the true signal line and the complementary signal line. If the voltage difference is not sufficient because of the low voltage on the complementary line, the sense data circuit may detect an incorrect value.

The voltage level on true signal line 50 and complementary signal line 52 depicts what occurs in a read cycle in which the signal lines are adequately precharged in accordance with the present invention, shown in FIG. 4. The true signal line 50 and the complementary signal line 52 reach a high voltage level during the precharge stage between $t_1$ and $t_2$, as shown, because of the decreased RC delay affecting the multiple precharge devices. The complementary signal line is consequently at a high voltage level by the end of the precharge stage. Thus at $t_3$, the sense data circuit detects the correct digital value "zero".

Adding multiple precharge circuits to decrease the precharge time adds some additional load to the equilibrate bus, but the additional load is relatively small. Therefore, any slight additional delay in the equilibrate signal caused by the additional load to its bus is more than compensated for by the time saved during the precharge process itself. Even with the additional precharge drivers, the total capacitive load on the equilibrate bus is low enough that it can be driven in a timely manner compared to the data bus.

The present invention thereby reduces the RC time constant of an internal bus and reduces the time necessary to precharge the data bus. This improvement reduces the time needed for a read cycle and increases overall efficiency of the integrated circuit.

While the invention has been particularly shown and described with reference to a preferred embodiment, it will be understood by those skilled in the art that various changes in form and detail may be made therein without departing from the spirit and scope of the invention.

What is claimed is:

1. An integrated circuit, comprising:
   a plurality of memory sub arrays on a single integrated circuit device;
   a local true and complement bit line for each memory sub array;
   a local sense amplifier for each sub array, connected to the local true and complement signal lines for each sub array;
   a driver circuit for each sub array, connected to an output of the sub array local sense amplifier, and having true and complementary outputs;
   a data bus having a true signal line and a complementary signal line, wherein each have a first and second end, wherein the true signal line is connected to the true outputs of each of the driver circuits, and wherein the complementary signal line is connected to the complementary outputs of each of the driver circuits;
   means for generating a control signal;
   a first precharge device which electrically connects a first location of the true signal line and a first location of the complementary signal line to a preselected voltage supply such that the first precharge device is conductive in response to the control signal; and
   a second precharge device, spaced from the first precharge device by a distance approximately equal to a length of the true signal line, which electrically connects a second location of the true signal line and a second location of the complementary signal line to the preselected voltage supply such that the second precharge device is conductive in response to the control signal.

2. The integrated circuit of claim 1, further comprising at least one additional precharge device, connected approximately between the first and second locations, wherein the additional precharge device electrically connects the true signal line and the complementary signal line to the preselected voltage supply such that the second precharge device is conductive in response to the control signal.

3. The integrated circuit of claim 1, further comprising a plurality of precharge devices distributed along the length of the data bus which electrically connect the true signal line and the complementary signal line to the preselected voltage supply such that the second precharge device is conductive in response to the control signal.

4. The integrated circuit of claim 1, wherein the precharge devices further comprise a conductive path between the true signal line and the complementary signal line, and wherein the conductive path is conductive in response to the control signal.

5. The integrated circuit of claim 4, wherein the preselected voltage supply is a high voltage supply, and wherein each of the precharge devices further comprises:
   a first pull-up transistor having a conductive path between the true signal line and the high voltage supply;
   a second transistor having a conductive path between the true signal line and the complementary signal line; and
   a third pull-up transistor having a conductive path between the complementary signal line and the high voltage supply;
   wherein the first, second, and third transistors are electrically connected to the control signal in such a manner that the transistors are conductive when the control signal is at a first state and are non-conductive when the control signal is at a second state.

6. The integrated circuit of claim 4, wherein the preselected voltage supply is a low voltage supply, and wherein each of the precharge devices further comprises:
   a first pull-down transistor having a conductive path between the true signal line and the low voltage supply;
   a second transistor having a conductive path between the true signal line and the complementary signal line; and
   a third pull-down transistor having a conductive path between the complementary signal line and the low voltage supply;
   wherein said first, second, and third transistors are electrically connected to the control signal in such a manner that the transistors are conductive when the control signal is at a first state and are non-conductive when the control signal is at a second state.

7. The integrated circuit of claim 1, wherein the preselected voltage supply is a high voltage supply, and wherein each of the precharge devices further comprises:
   a first pull-up transistor having a conductive path between the true signal line and the high voltage supply;
   a second pull-up transistor having a conductive path between the complementary signal line and the high voltage supply;
   wherein the first and second transistors are electrically connected to the control signal in such a manner that the transistors are conductive when the control signal is at a first state and are non-conductive when the control signal is at a second state.

8. The integrated circuit of claim 1, wherein the preselected voltage supply is a low voltage supply, and wherein each of the precharge devices further comprises:
   a first pull-down transistor having a conductive path between the true signal line and the low voltage supply;
   a second pull-down transistor having a conductive path between the complementary signal line and the low voltage supply;
   wherein said first and second transistors are electrically connected to the control signal in such a manner that the transistors are conductive when the control signal is at a first state and are non-conductive when the control signal is at a second state.

9. An integrated circuit of claim 1, wherein the data bus is electrically connected to a data sense circuit, for detecting a value therefrom.

10. An integrated circuit, comprising:
a plurality of memory sub arrays on a single integrated circuit device;
a plurality of local true and complement bit lines for each memory sub array;
a plurality of local sense amplifiers for each sub array, connected to the local true and complement signal lines for each sub array;
a plurality of driver circuits for each sub array, connected to outputs of the sub array local sense amplifiers, and having true and complementary outputs;
a plurality of true signal lines and a plurality of complementary signal lines, wherein each of the complementary signal lines is associated with one of the true signal lines to form a pair, wherein each true signal line is connected to the true outputs of one of the driver circuits for each sub array, and wherein each complementary signal line is connected to the complementary outputs of one of the driver circuits for each sub array;
a plurality of sense amplifiers, wherein each of the sense amplifiers is associated with one of the pairs of the true and complementary signal lines, and wherein each of the sense amplifiers has a first output for driving the true signal line in the associated pair to a first value, and a second output for driving the complementary signal line in the associated pair to a complementary signal value; and
a plurality of precharge devices associated with each of the pairs of the true and complementary signal lines and distributed along the length of the signal lines, wherein each of the precharge devices charges the true and complementary signal lines to a preselected value upon receipt of a control signal.

11. The integrated circuit of claim 10, wherein each of the precharge devices further connects the paired true and complementary signal lines together upon receipt of the control signal.

12. The integrated circuit of claim 10, wherein the preselected value is a power supply voltage value.

13. The integrated circuit of claim 12, wherein the preselected power supply voltage value is the most positive value of a power supply.

14. The integrated circuit of claim 12, wherein the preselected power supply voltage value is the most negative value of a power supply.

15. The integrated circuit of claim 10, wherein each of the precharge devices further comprises:
a first pull-up transistor having a conductive path between the true signal line of a pair and a high voltage supply of the integrated circuit;
a second transistor having a conductive path between the true signal line and the complementary signal line; and
a third pull-up transistor having a conductive path between the complementary signal line of a pair and the high voltage supply;
wherein the first, second, and third transistors are electrically connected to the control signal in such a manner that the transistors are conductive when the control signal is at a first state and are non-conductive when the control signal is at a second state.

16. The integrated circuit of claim 10, wherein each of the precharge devices further comprises:
a first pull-down transistor having a conductive path between the true signal line of a pair and a low voltage supply;
a second transistor having a conductive path between the true signal line and the complementary signal line; and
a third pull-down transistor having a conductive path between the complementary signal line of a pair and the low voltage supply;
wherein said first, second, and third transistors are electrically connected to the control signal in such a manner that the transistors are conductive when the control signal is at a first state and are non-conductive when the control signal is at a second state.

* * * * *